United States Patent [19]

King et al.

[11] Patent Number: 4,912,020

[45] Date of Patent: * Mar. 27, 1990

[54] PRINTED CIRCUIT BOARDS AND METHOD FOR MANUFACTURING PRINTED CIRCUIT BOARDS

[75] Inventors: David R. King, Merion Station, Pa.; Mark S. Lee, Columbia; Richard W. Decker, Baltimore, both of Md.

[73] Assignee: Westinghouse Electric Corp., Pittsburgh, Pa.

[*] Notice: The portion of the term of this patent subsequent to Sep. 6, 2005 has been disclaimed.

[21] Appl. No.: 240,852

[22] Filed: Sep. 2, 1988

Related U.S. Application Data

[63] Continuation-in-part of Ser. No. 921,284, Oct. 21, 1986, Pat. No. 4,769,309.

[51] Int. Cl.4 .................................................. G03C 5/00
[52] U.S. Cl. ...................................... 430/311; 430/312; 430/313; 430/314; 430/315; 430/316; 430/317; 430/318; 430/319; 430/329; 156/230; 156/233; 156/234; 156/625; 156/629; 156/630; 156/659.1; 156/661.1; 156/901; 427/96
[58] Field of Search .......................... 430/311-319, 430/329; 156/230, 233, 234, 625, 629, 630, 659.1, 661.1, 901; 427/96

[56] References Cited

U.S. PATENT DOCUMENTS

| | | | |
|---|---|---|---|
| 2,650,886 | 9/1953 | Zelley | 117/130 |
| 2,676,916 | 4/1954 | Zelley | 204/33 |
| 3,181,986 | 5/1965 | Pritikin | 156/233 |
| 3,913,223 | 10/1975 | Gigoux | 29/625 |
| 3,953,924 | 5/1976 | Zachry et al. | 29/625 |
| 3,969,199 | 7/1986 | Berdan et al. | 204/33 |
| 4,606,787 | 8/1986 | Pelligrino | 156/632 |
| 4,615,945 | 10/1986 | Iida | 428/335 |
| 4,769,309 | 9/1988 | King et al. | 430/311 |

OTHER PUBLICATIONS

Patent Cooperation Treaty (PCT) International Search Report dated 5/17/89 for International Application No. PCT/US 88/03102, which is the PCT counterpart of the subject application, U.S. Serial No. 240,852.
IBM Technical Disclosure Buletin, Vol. 11, No. 12, May 1969, (New York, U.S.), K. F. Greene: "Producing Printed Circuit Boards", pp. 1676-1677 (see the whole document).
IBM Technical Disclosure Bulletin, vol. 20, No. 9, Feb. 1978, (New York, U.S.), J. G. Cutillo et al. "High Resolution Circuitization Process", pp. 3389-3390 (see the whole document).

*Primary Examiner*—Ellis P. Robinson
*Assistant Examiner*—P. J. Ryan
*Attorney, Agent, or Firm*—W. G. Sutcliff

[57] ABSTRACT

A printed circuit board is described in which an electrically insulating laminate material (40) has first and second sides. An electrically conducting first circuit pattern (15) is embedded in the first side of the laminate material (40), and an electrically conducting second circuit pattern (20) is embedded in the second side of the laminate material (40) electrically insulated from the first circuit pattern (15) by the laminate material (40). A solid interconnection member (20) extends through the laminate material (40) and electrically contacts both the first and second circuit patterns (15,20) at selected locations thereof.

The method for fabricating the board includes as a first step the fabrication of a first board panel (10) having a raised electrically conducting first circuit pattern (15) extending from a base layer (14) of conductive material and a raised electrically conducting second circuit pattern (20) extending from the first circuit pattern (15). A second board panel (30) is also fabricated, having a raised electrically conducting third circuit pattern (35) extending from another base layer (34) of conductive material. The first board panel (10) is laminated to the second board panel (30) with a laminate insulating material (40) disposed therebetween electrically insulating the first circuit pattern (15) from the third circuit pattern (35) and with the second circuit pattern (20) electrically contacting the first circuit pattern (15) at selected portions thereof. Finally, the base layers (14,34) of conductive material are removed from the laminate insulating material (40).

40 Claims, 11 Drawing Sheets

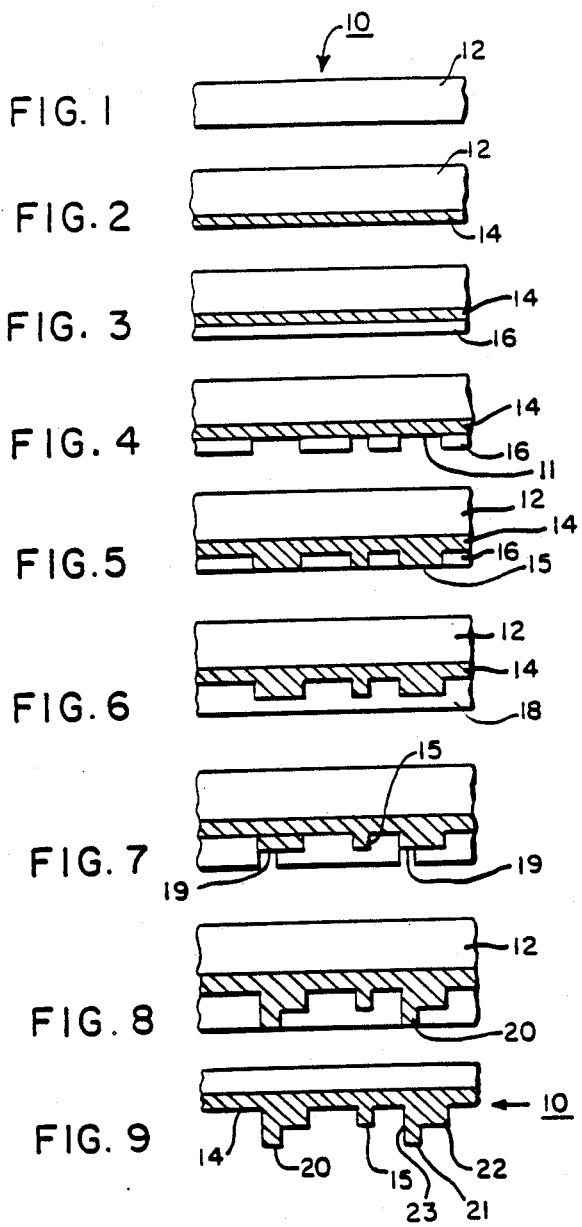

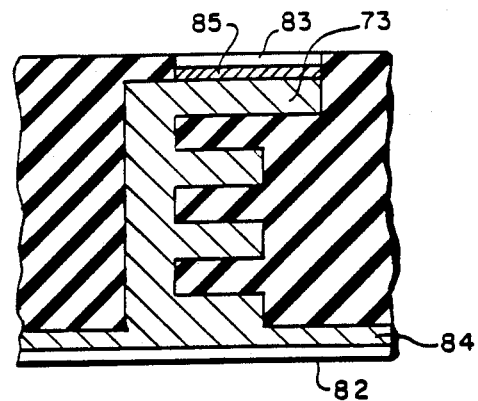
FIG. 25
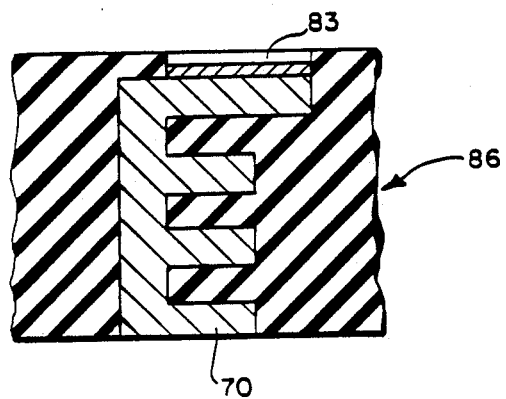
FIG. 26

PRINTED CIRCUIT BOARDS AND METHOD FOR MANUFACTURING PRINTED CIRCUIT BOARDS

This application is a continuation-in-part of U.S. Ser. No. 921,284, filed Oct. 21, 1986, issued as U.S. Pat. No. 4,769,309 on Sept. 6, 1988, and entitled "Printed Circuit Boards and Method for Manufacturing Printed Circuit Boards".

BACKGROUND OF THE INVENTION

This invention relates generally to electrical apparatus, and more particularly to printed circuit boards and the method of manufacturing printed wiring or circuit boards.

State of the art printed circuit and wiring boards are requiring smaller and smaller circuitry. The present subtractive and semi-additive processes, though they can in many cases meet the needs of the industry today, are rapidly being pushed to the limit of their capability to provide the fine circuitry features required Tighter controls are needed to even attempt fine line boards, and yields drop off dramatically as the lines and spaces get smaller In conventional printed wiring technology, circuitry is fabricated in layer pairs, with a layer of circuitry being disposed on either side of a sheet of dielectric material The layer pairs are laminated together and drilled and plated to make the completed multilayer structure. The conventional method of etching back copper clad dielectric material to produce circuitry has proved to be inadequate when dealing with extremely fine lines. A major problem with this prior art method is the undercutting that accompanies the etching of the copper cladding Etching the sides of the circuitry decreases the line width in such a way that the circuitry does not always have straight sides. The etching is also not completely uniform, so that some lines will have more of their sides etched away than other lines The tolerances that are inherent with the etching process are not good enough to meet the very large scale integrated circuit requirements Another problem in the prior art fabrication of printed circuit and wiring boards concerns the method of making interconnections between the various layers of a multilayer board This prior method involves drilling holes through copper and board material, and then plating copper through the hole to make the electrical connection. Because of problems associated with attempting this copper plating process, a good percentage of failures of printed wiring boards are related to the plated through holes. Furthermore, in order to accommodate this method of interconnecting, the art work utilized in fabricating the boards is designed with pads at the hole locations These pads must be several times larger than the circuitry in order to provide a big enough target for the drill The density of the circuitry, therefore, is limited because of the large pads that must be worked around.

U.S. Pat. No. 4,606,787, issued Aug. 19, 1986 and entitled "Method nd Apparatus for Manufacturing Multilayer Printed Circuit Boards", describes a method by which printed circuit boards are fabricated using an additive process for creating the conductive lines on the board. This method eliminates the etching difficulties, but still retains the hole plating procedure for providing interlayer circuit connections Another disadvantage of the prior art fabrication of printed wiring boards concerns the pads utilized for the attachments of the very large scale integrated (VLSI) circuit packages which are to be mounted on the boards. In particular, the solder deposition and lead separation of high density VLSI printed wire assemblies has been a difficult task. Solder mask have been investigated; however, many are difficult to process, are unable to withstand extreme environmental conditions, and are not able to be fabricated to the applicable size requirements.

One common method of surface mounting the VLSI component assemblies on the boards includes soldering the leads of the components to pads on the board. On boards with a large number of pads, it is necessary to find an alternate method to soldering the leads individually. If enough solder is located at each pad, the board can be heated using a vapor phase or comparable process and all the component leads can be soldered simultaneously. Though there exists several methods for placing the solder on the pads, there exists a problem with dense circuitry, for unless the solder is contained, it can flow between the pads and form solder bridges. These bridges then short circuit the board, rendering it useless.

SUMMARY OF THE INVENTION

The above described disadvantages in the prior art are overcome by the printed circuit board of the present invention. The printed circuit board includes an electrically insulating laminate material having first and second sides with an electrically conducting, hereafter referred to for simplicity as conductive, first circuit pattern embedded in the first side of the laminate material and a conductive second circuit pattern embedded in the second side of the laminate material. The second circuit pattern is electrically insulated from the first circuit pattern by said laminate material. A solid interconnection member extends through the laminate material and electrically contacts both the first and second circuit patterns at selected locations thereof.

The method for fabricating the multilayer printed circuit board includes as a step the fabrication of a first board panel having a raised conductive first circuit pattern extending from a base layer of conductive material. A second board panel is also fabricated, having a raised conductive second circuit pattern extending from a its base layer of conductive material and a raised conductive third circuit pattern extending from the second circuit pattern. The first board panel is laminated to the second board panel with a laminate insulating material disposed therebetween electrically insulating the first circuit pattern from the second circuit pattern and with the third circuit pattern electrically contacting the first circuit pattern at selected portions thereof. Finally, the base layers of conductive material are removed from the laminate insulating material.

One method for fabricating the top board panel of the printed circuit board o provide for recessed component mounting pads includes as the first step the fabrication of a member having a raised conductive circuit pattern extending from a first, or base, layer of conductive material which may be disposed on a substrate or extending from the substrate itself which may, if electrically conductive, act as the first layer of conductive material. The raised conductive circuit pattern on the first conductive layer is embedded within a laminate insulating material having a thickness greater than the height of the raised circuit pattern. A hole is drilled through the laminate insulating material to expose the circuit pattern at those selected positions where the component mounting pads are to be located. A second layer of conductive material is deposited upon the exposed surfaces of the circuit pattern to a thickness less than the thickness of the insulating material above he circuit pattern.

The first, or base, layer of conductive material is removed from both the laminate insulating material and a second layer of conductive material which is the raised conductive circuit pattern, whereby the second layer of conductive material is located in the laminate insulating material and is exposed but recessed from the surface of the insulating material.

An alternative method for fabricating the top board panel of the printed circuit board to provide for recessed component mounting pads includes as the first step the fabrication of a member having a raised conductive first circuit pattern extending from a first, or base, layer of conductive material. The first layer of conductive material may be a layer disposed on a substrate or this first layer of conductive material may simply be a conductive substrate A raised conductive thin second circuit pattern is deposited on the first circuit pattern corresponding to the desired locations of component mounting pads, and a second layer of conductive material is deposited upon the second circuit pattern to further raise the conductive second circuit pattern above the general plane of the first circuit pattern. The raised conductive first and second circuit patterns and the second layer of conductive material on the first layer of conductive material are embedded within a uniform thickness of laminate insulating material with the surface of the second layer of conductive material being exposed. The second layer of conductive material is removed until the second circuit pattern is exposed, and a third layer of conductive material is deposited upon the exposed surface of the second circuit pattern to a thickness less than the thickness of the second layer of conductive material. The first layer of conductive material is separated from the substrate, and the first layer of conductive material is removed from the laminate insulating material, whereby the third layer of conductive material is embedded in the laminate insulating material and is exposed but recessed from the surface of the insulating material.

BRIEF DESCRIPTION OF THE DRAWINGS

Reference is now made to the description of the preferred embodiments, illustrated in the accompanying drawings, in which:

FIGS. 1-9 illustrate, sequentially, the steps for fabricating one of the center board panels of the multilayer printed wiring board;

FIGS. 22-26 illustrate sequentially the process for completing fabrication of the multilayer printed wiring board;

DESCRIPTION OF THE PREFERRED EMBODIMENT

Figure 10:
FIGS. 10-15 illustrate, sequentially, the steps for fabricating the other of the center board panels of the printed wiring board.

The invention described in the present application will enable fine line boards to be produced using an additive process. The lines will be built up using a deposition process, such as electroplating, and since it is an additive process, the size of the lines will not be etched at all, thereby greatly increasing the dimensional integrity of the lines and spaces. The printed wiring board of the present invention has better circuit stability during lamination than those boards produced by prior art processes because the circuit traces are either anchored to an electrically conductive material such as copper or imbedded into the dielectric material separating the lines.

The fabrication of the multilayer printed wiring board of the present invention begins with the middle two layers, or board panels, of the printed wiring board, which are eventually laminated together, and then continues with the next outer layers or panels being laminated to the middle pair, and so on until the entire board is laminated together into a single structure Referring now more particularly to FIGS. 1-9, therein is illustrated the sequential steps utilized in fabricating one of the middle layers, or board panels, of the multilayer board. The fabrication of the panel 10 requires that it be formed with one or more interlayer connection members, or pillars 20 which, as to be explained in greater detail herein, are utilized to provide electrical connection between the various panels. The fabrication of the panel 10 begins with a temporary substrate 12 (FIG. 1) made of a material such as reusable type 304 stainless steel plate with a 2B finish. The plate 12 would typically be 0.075 inches thick and be mechanically and chemically cleaned.

The first step in the manufacture of the panel 10 is to deposit, by process such as electroplating, a uniform thin first layer 14 of an electrically conducting, hereafter referred to for simplicity as conductive, material such as copper on the substrate 12 so as to form a layer of approximately 0.0004 inches of copper over the entire substrate 12. Note that although other known methods of deposition such as electroless chemical processes or spraying processes including sputtering, evaporation and ion deposition are available, electroplating is a preferred method of deposition. The copper layer 14 serves as a base layer, also known as a flash layer, upon which further electroplating of conductor lines may be applied, and also serves as a releasing material for separating the printed circuitry from the stainless steel substrate 12 after formation of the panel 10 is complete.

The copper layer 14 is then coated with a photosensitive resist layer 16 (FIG. 3 of a material such as that sold under the trademark DuPont Riston. The next step (FIG. 4) is to mask the photoresist 16 with a first photomask of the circuit pattern desired to be impressed upon the layer 14, and then the photoresist 16 is exposed to ultraviolet light, preferably from a collimated light source. The photoresist 16 is then developed away where the circuit pattern was, forming three-dimensional cavities 11 in the resist 16 and exposing the layer 14. The panel 10 is then plated (FIG. 5) utilizing a deposition process such as electroplating to form a second layer 15 of conductive material such as copper upon the exposed portions of the first layer 14 of conductive material to form a raised conductive first circuit pattern above the general plane of the conductive layer 14 conforming to the three-dimensional cavity definition of the photosensitive resist 16 image.

After this step has been completed, the panel 10 is ready for further processing to fabricate the interlayer connection members. As illustrated in FIG. 6, the panel 10, and more particularly the second layer 15 of copper, is coated with a layer 18 of photosensitive resist. The photoresist 18 is then masked with a second photomask to define a conductive second circuit pattern on the surface of the resist 18 corresponding to the desired locations of the interlayer connection members. The photoresist 18 is then exposed to light, and the resist 18 is dissolved away (FIG. 7) to form three-dimensional cavities 19 in the resist 18 and exposing the second layer 15 according to the second circuit pattern. A third layer 20 of conducting material such as copper is then deposited (FIG. 8), by a process such as electroplating, on the second layer 15 to provide a raised conductive second circuit pattern above the general plane of the second layer 15 conforming to the three-dimensional cavity 19 image of the photosensitive resist 19 image. This third layer 20 of conductive material is the interlayer connection member, or pillar, which is utilized to provide electrical connection between the circuitry of the panel 10 and the panel 30 to which it is to be connected.

After the pillars 20 have been fabricated to the desired thickness, the panel 10 is prepared for lamination (FIG. 9). The photoresist 18 is removed from the panel 10 utilizing a stripping solution, thereby exposing top 21 and sidewall 23 surface portions of the raised first and second circuit patterns This panel 10 is now ready to be laminated to form a section of the multilayer printed wiring board.

FIGS. 10-15 illustrate sequentially the steps that may be utilized for making a second board panel 30 of the printed wiring board. The second panel 30, which can be laminated to the first panel 10 to form the center pair of panels of the multilayered board, differs from the fabrication of the first panel 10 in that the pillars 20 are not required if the panel 30 is to be laminated to the panel 10.

The fabrication of the panel 30 begins with a temporary substrate 32 (FIG. 10) made of a material such as reusable type 304 stainless steel plate with a 2B finish. The plate 32 would typically be 0.075 inches thick and be mechanically and chemically cleaned.

Figure 11:
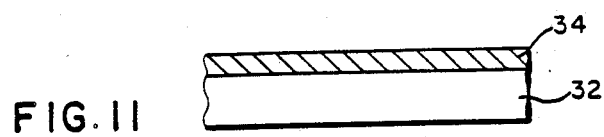
Figure 12:
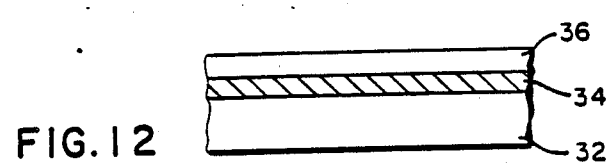
Figure 13:
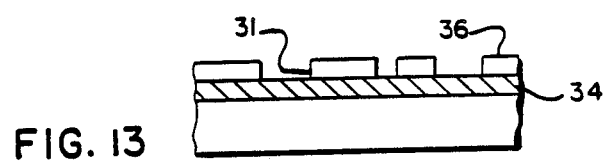
Figure 14:
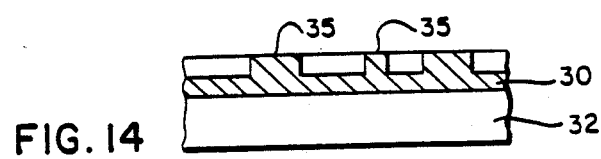
Figure 15:
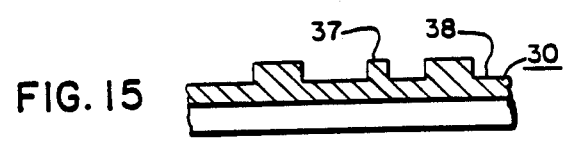

The first step in the manufacture of the panel 30 is to deposit, by a process such as electroplating, a uniform thin first layer 34 of a conductive material such as copper on the substrate 32 so as to form a layer of approximately 0.0004 inches of copper over the entire substrate 32 (FIG. 11). Note that although other known methods of deposition such as electroless chemical processes or spraying processes including sputtering, evaporation and ion deposition are available, electroplating is a preferred method of deposition The copper layer 34 serves as a base layer upon which further electroplating of conductor lines may be applied, and also serves as a releasing material for separating the printed circuitry from the stainless steel substrate 22 after formation of the panel 30 is complete.

The copper layer 34 is teen coated with a photosensitive resist layer 36 (FIG. 12) of a material such as that sold under the trademark DuPont Riston. The next step (FIG. 13) is to mask the photoresist 36 with a photomask of the circuit pattern desired to be impressed upon the layer 34, and then the photoresist 36 is exposed to light, preferably from a collimated light source. The photoresist 36 is then developed away where the circuit pattern was, forming three-dimensional cavities 31 in the resist 36 and exposing the copper 34. The panel 30 is then plated (FIG. 14) utilizing a deposition process such as electroplating to form a second layer 35 of conductive material such as copper upon the exposed portions of the first layer 34 of conductive material to form a raised conductive circuit pattern above the general plane of the conductive layer 34 conforming to the three-dimensional cavity definition of the photosensitive resist 36 image.

The photoresist 36 is removed from the panel 30 utilizing a stripping solution, thereby exposing top 37 and sidewall 38 surface portions of the raised circuit patterns. This panel 30 is now ready to be laminated to form a section of the multilayer printed wiring board.

Figure 16:
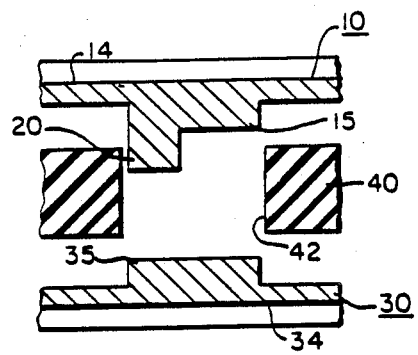
FIGS. 16-18 illustrate sequentially the manufacturing steps involved in joining the two center board panels of the printed wiring board fabricated in accordance with FIGS. 1-15.
Figure 17:
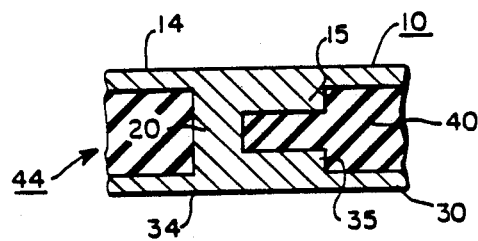
Figure 18:
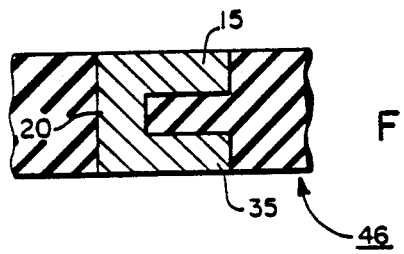

Referring now more particularly to FIGS. 16-18, there is illustrated the sequential steps utilized for joining, through lamination, the first and second middle panels 10, 30 respectively. In FIG. 16, an epoxy glass laminate insulating material 40 has a plurality of openings 42 therethrough which correspond with the location of the pillars 20 of the panel 10. The panels 10, 30 are disposed adjacent to each other and aligned with each other such that the circuit patterns 15 and 20 on panel 10 and the circuit pattern 35 on panel 30 face each other, with the epoxy glass laminate insulating material 40 being disposed therebetween. As shown in FIG. 17, this structure of panels 10, 30 and dielectric 40 are then laminated together to form a unitary structure 44, which if so desired can be a complete printed circuit board. Electrical connection between circuit pattern 15 and circuit pattern 35 is provided through the solid interlayer connection member 20, which was formed integrally bonded to layer 15 an which electrically contacts the layer 35, at least at selected portions thereof. The temporary substrates 12,32 are then separated from the layers 14,34 respectively to form the unitary structure 44.

This unitary structure 44 is ten subjected to an etching process (FIG. 18) to remove the first layers of conductive material 14, 34, resulting in a unitary structure 46 which can be either an entire board, or can be the innermost panel pair of a larger printed circuit board. This structure 46 includes only the circuitry 15, 35 of the original two panels 10,30 together with the solid interconnecting pillar 20 which provides electrical connection between the circuitry 15, 35. The dielectric material 40 is utilized to prevent electrical contact between the circuitry 15, 35 except at the locations of the interconnecting pillars 20.

It should be noted that the circuitry 15, 35 is held fixed within the dielectric on three sides thereof, which results in no movement of the circuitry and permits greater accuracy when interconnecting additional layers thereto. It also should be noted that the conductive circuit patterns 15,35 are exposed and lay flush and coplanar with the surface of the laminate insulator material 40, with uniform cross-section thickness across the entire structure 46.

Figure 19:
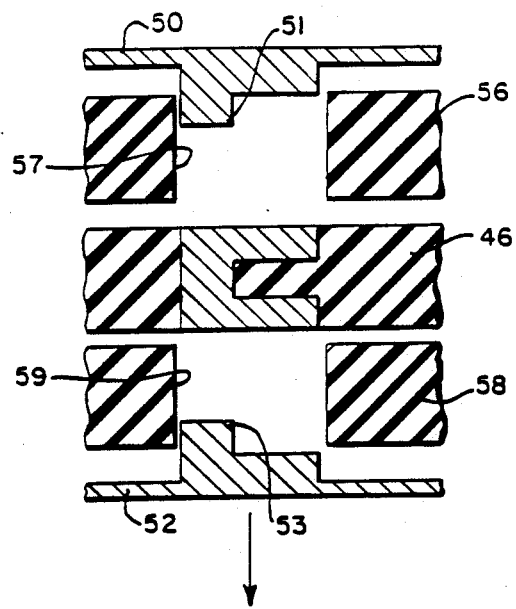
FIGS. 19-21 illustrate the fabrication of the printed wiring board with additional board panels added.
Figure 20:
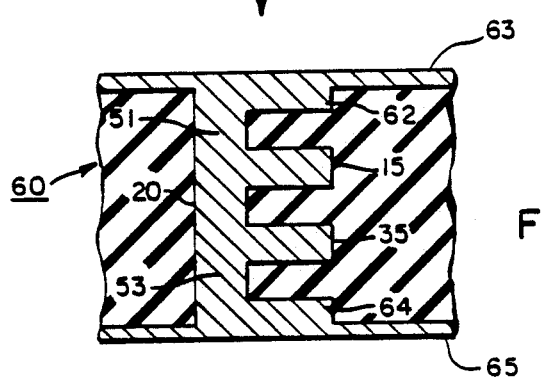
Figure 21:
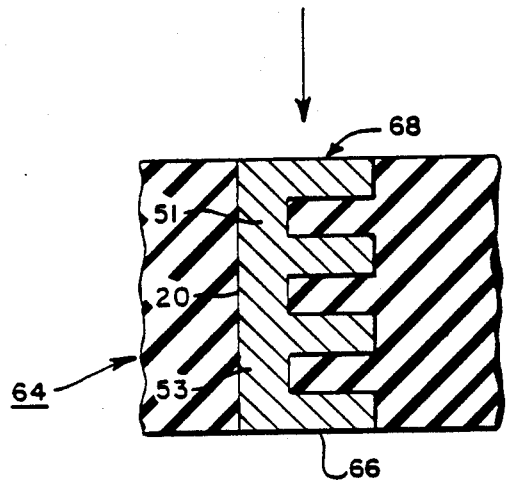
Figure 22:
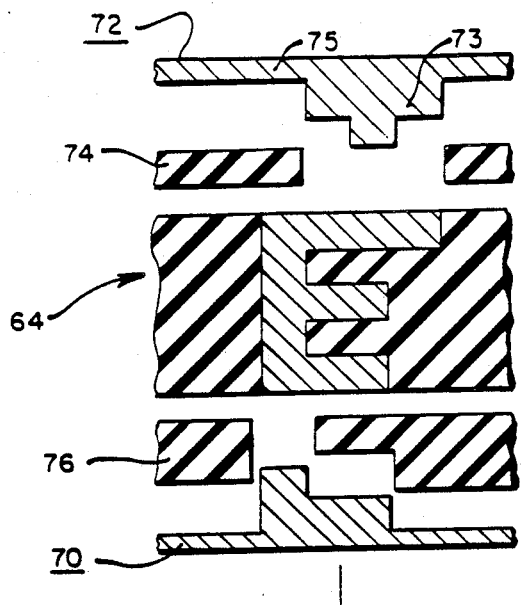

FIGS. 19-21 describe in greater detail how additional panels would be connected to the middle structure 46 illustrated in FIG. 18. In FIG. 19, additional panels 50 and 52 would be fabricated utilizing the process described in FIGS. 1-9, including circuitry patterns 62, 64 and the pillars 51, 53 as the interlayer connection members corresponding to the pillar 20 in FIG. 9. The middle structure 46 would then be sandwiched between the upper panel 50 and the lower panel 52, separated by the laminate insulating materials 56, 58 with their aligned holes 57, 59 respectively therein. This entire sandwiched package is then laminated, as in FIG. 20, to provide a unitary structure 60 in which multiple circuitry patterns 62, 15, 35, 64 are electrically interconnected by the pillars 51, 20, 53. The final step at this time is, similarly to that previously described, to remove the excess copper flash 63, 5 by an etching process to provide a multilayered printed wiring board structure 64 encased in dielectric insulating material and exposed only at the outer surfaces 68, 66 thereof. Furthermore, the interconnecting pillars 51, 20, 53 are solid copper members which insure electrical connection without the necessity of drilling holes in attempting to electroplate the interior thereof.

As can be readily appreciated, the process can continue as described for as many panels as are desired. During each lamination process, the outermost panels are laminated to the previously laminated internal structure, with all electrical connections between layers taking place through solid interlayer connection members corresponding to the pillars 20, 51 53.

Referring now to FIGS. 22-26, therein is illustrated how the final two panels would be laminated to the completed structure 64. Typically, the final bottom panel 70 would be fabricate similarly to that described in FIGS. 1-9. The top panel 72 would similarly be fabricated, except that this panel 72 would generally not contain circuitry but instead would comprise only the pads 73 that would be utilized for soldering the component to be mounted to the circuitry, although if desired circuitry could, of course, be included within the panel 72.

Figure 23:
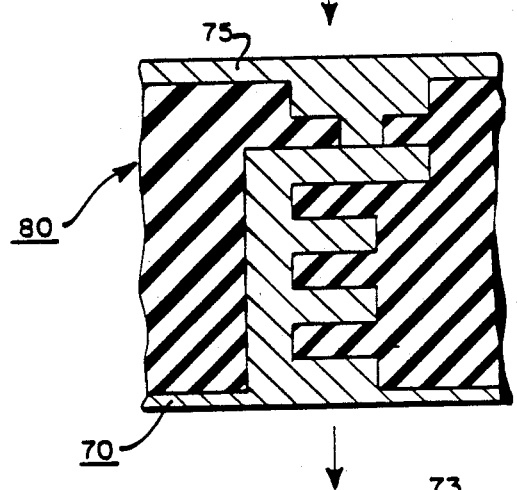
Figure 24:
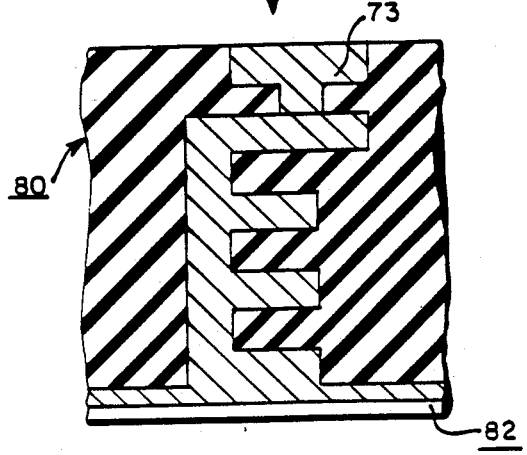
Figure 27:
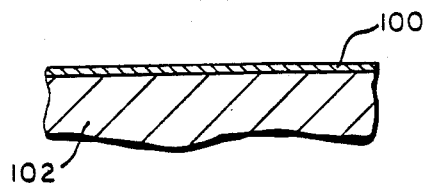
FIGS. 27-45 illustrate sequentially the steps involved in forming a board panel having plated pillar recessed pads which can be utilized for providing component mounting locations on the printed wiring board of this invention.
Figure 28:
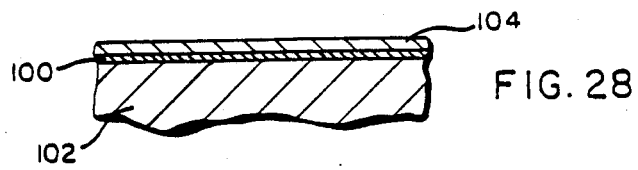
Figure 29:
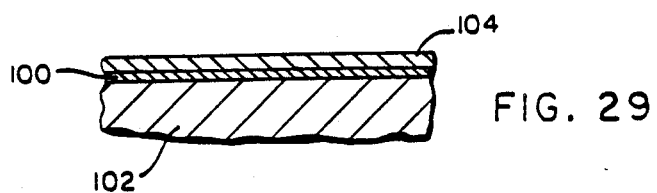
Figure 30:
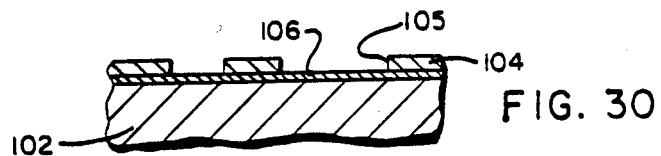
Figure 31:
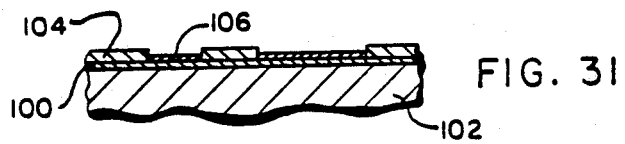

Similarly to the manufacturing process described above, the interior structure 64 is sandwiched between additional dielectric laminate insulating material 74, 76, and the outer panels 70, 72. As shown in FIG. 23, these panels and laminate are laminated to each other to form a unitary structure 80. In FIG. 24, the lower most panel 70 is covered with a protective mask 82, and the copper flash 75 is removed from the upper panel 72. The panel 72, containing the component mounting pad 73, is then etched and exposed to provide a recessed pad 73 for the mounting of the components (FIG. 25). This recessed pad 73 then has deposited upon it, and completely or partially filling the recess 85, a predetermined amount of solder material 83 until it is at or below the level of the remainder of the surface of the board. After this step, the etch mask 82 is removed and the copper flash 84 is etched and removed from the panel 70. After this step, as illustrated in FIG. 26, there exists a completed multilayer printed wiring board.

A printed wiring board as manufactured according to the fabrication steps herein described has many fundamental advantages that permit it to be utilized in the assembly of advanced VLSI circuits. The interlayer connections formed require less surface area on each layer than those formed in the prior art, resulting in the ability to fabricate denser circuitry. Furthermore, these solid interlayer connectors are less susceptible to cracking during temperature stressing than the conventional plated throughhole interconnectors. The manufacturing process, as described, can provide for the formation of recessed component mounting pads. The circuitry lines and spaces and interconnections are imbedded in a dielectric material giving higher precision and stability during fabrication, and the surface of the printed wiring board is smooth for easier assembly.

While the pad mounting panel 72 described above is preferable, n alternative method of fabricating this panel may be utilized. A method of independently fabricating this top, component mounting panel is sequentially illustrated in FIGS. 27-45.

The fabrication of the panel 128 (FIG. 45) begins with a temporary substrate 102 (FIG. 27) made of a material such as reusable type 304 stainless steel plate with a 2B finish. The plate 102 would typically be 0.075 inches thick and be mechanically and chemically cleaned.

The first step in the manufacture of the panel 128 is to deposit, by a process such as electroplating, a uniform thin first layer 100 of a conductive material such as copper on the substrate 102 so as to form a layer of approximately 0.0004 inches of copper over the entire substrate 102. Note that although other known methods of deposition such as electroless chemical processes or spraying processes including sputtering, evaporation and ion deposition are available, electroplating is a preferred method of deposition. The copper layer 100 serves as a base layer upon which further electroplating may be applied, and also serves as a releasing material for separating the printed circuitry from the stainless steel substrate 102 after formation of the panel 128 is complete.

The copper layer 100 is then coated with a photosensitive resist layer 104 (FIG. 28) of a material such as that sold under the trademark DuPont Riston. The next step (FIG. 29) is to mask the photoresist 104 with a first photomask of the circuit pattern desired to be impressed upon the layer 100, and then the photoresist 104 is exposed to ultraviolet light, preferably from a collimated light source. The photoresist 104 is then developed away where the circuit pattern was, forming three-dimensional cavities 105 (FIG. 30) in the resist 104 and exposing the layer 100. The panel 128 is then plated (FIG. 31) utilizing a deposition process such as electroplating to form a second layer 106 of conductive material such as copper upon the exposed portions of the first layer 100 of conductive material to form a raised conductive first circuit pattern above the general plane of the conductive layer 100 conforming to the threedimensional cavity definition of the photosensitive resist 104 image.

Figure 32:
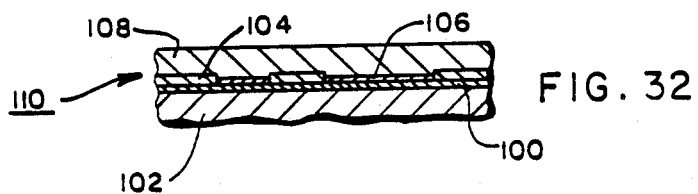
Figure 33:
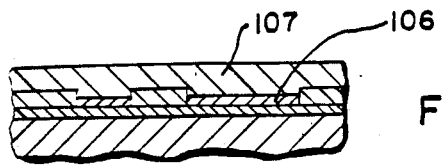
Figure 34:
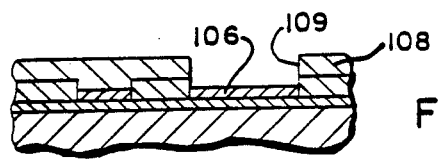
Figure 35:
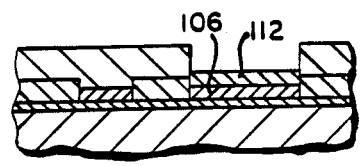
Figure 36:
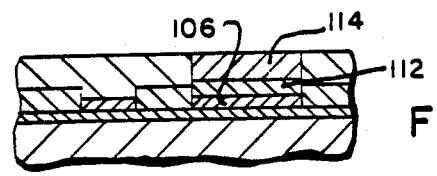

After this step has been completed, the panel 128 is ready for further processing to fabricate the component mounting locations or pads As illustrated in FIG. 32, the panel 128, and more particularly the second layer 106 of copper, is coated with a thick layer 108 of photosensitive resist. The photoresist 108 is then masked (FIG. 33) with a second photomask to define a conductive second circuit pattern on the surface of the resist 108 corresponding to the desired locations 107 of the component mounting pads The photoresist 108 is then exposed to light, and the resist 108 is dissolved away (FIG. 34) to form three-dimensional cavities 109 in the resist 108 and exposing the second layer 106 according to the second circuit pattern and the desired component mounting pad locations 107.

A thin third layer 112 of conductive material is deposited (FIG. 35), by a process such as electroplating, upon the exposed potions 107 of the second layer of copper 106 to form a raised conductive second circuit pattern above the general plane of the second conductive layer 106. This thin third layer 112 should be of an electrically conducting material different from the copper material of the second layer 106, such as nickel. This nickel coating 112 will ac as an etch resist subsequently in the process, and should be therefore, for example, approximately 0.0002 to 0.0003 inches thick.

After the nickel coating 112 is applied, a fourth layer 114 of electrically conducting material such as copper is deposited (FIG. 36), preferably by a process such as electroplating, upon the nickel layer 112 to further form the raised conductive second circuit pattern above the general plane of the third conductive layer 112 conforming to the three-dimensional cavity definition 109 of the photosensitive resist 108 image. The copper plating 114 utilized in this step will be subsequently removed to form the recessed component mounting pads.

Figure 37:
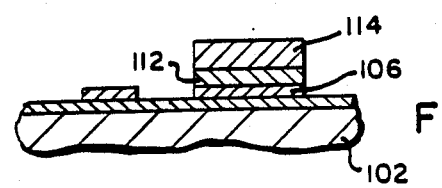
Figure 38:
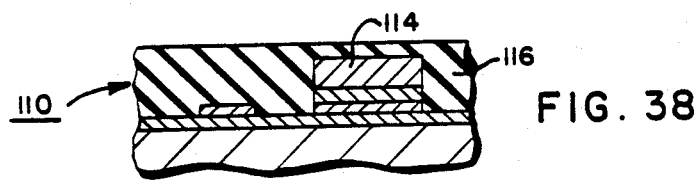
Figure 39:
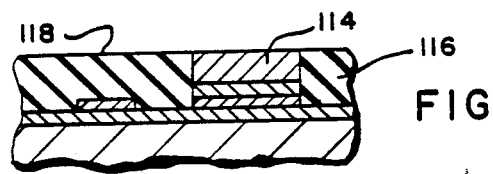
Figure 40:
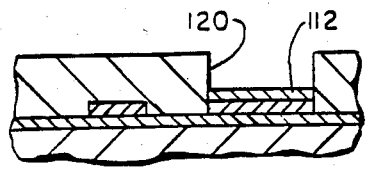

In FIG. 37, it is illustrated that all of the photoresists 108 is stripped and removed, with the result that the stainless steel substrate 102 now has a layer of copper 114 separated from the second layer 106 of circuitry by a nickel flash layer 112. The entire panel 128 is then laminated (FIG. 38) with an epoxy glass dielectric laminate insulating material 116 to the desired thickness. The surface 118 of the dielectric material 116 is then sanded (FIG. 39) so that the surface 118 is level and the copper layer 114 is exposed. The exposed copper layer 114 is then etched away (FIG. 40) down to the nickel coating 112, exposing the nickel layer 112 and resulting in a recess 120 in the surface 118 of the panel 128.

Figure 41:
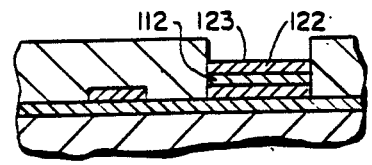
Figure 42:
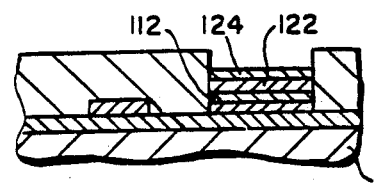
Figure 43:
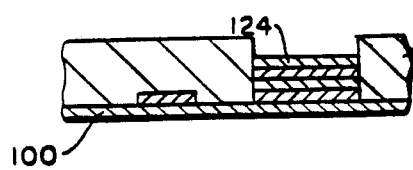
Figure 44:
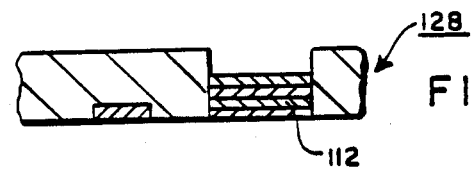
Figure 45:
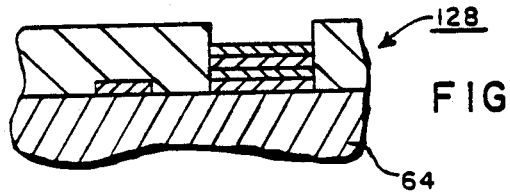
Figure 46:
FIGS. 46-54 illustrate sequentially an alternative method of forming the recessed solder pads illustrated in FIGS. 27-45.
Figure 47:
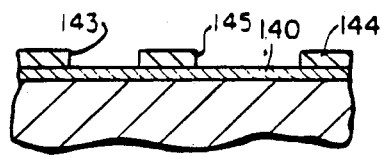
Figure 48:
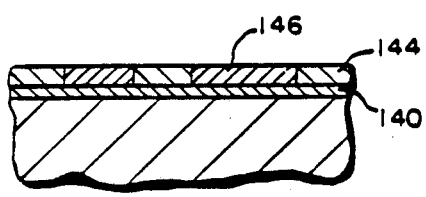

The recess 120 is now capable of having disposed therein a solder material to be used as the component mounting pad. Because the solder 122 will be plated to the nickel coating 112, the nickel 112 should be activated before the solder plating process occurs This nickel activation can be accomplished by placing the panel 128 in a 25% hydrochloric solution for approximately one minute. After the nickel coating 112 has been activated, a layer 122 of solder is deposited, by a process such as electroplating, upon the exposed surface of the nickel layer 112 (FIG. 41). This solder layer 122 should be of a thickness less than the thickness of the etched copper layer 114 so that the level of the solder layer 122 is below the surface 118 of the laminate 116, resulting in a recessed component mounting pad 123. A flash layer o copper is deposited (FIG. 42), using a process such as electroplating, upon the solder layer 122 as a protective layer and may be removed at any time.

The stainless steel substrate 102 is removed (FIG. 43) nd separated from the first conductive layer 100 and its raised first and second circuit patterns The copper layer 100 is then etched away (FIG. 44) from the laminate insulating material 116, resulting in one complete panel 128 which can then be laminated (FIG. 45) as the top layer of a multilayered printed wiring board 64. Electrical interconnection between this panel 128 and the remaining board 64 can be accomplished either by the use of conventional plated through holes or by the addition of the plated pillars previously described.

An alternative method for fabricating the top layer 72 of the wiring board, with its recessed component mounting pads, is illustrated in FIGS. 46-54. Similarly to the process described with respective FIGS. 27-45, the fabrication of the panel 160 begins with a temporary substrate 142 (FIG. 46) made of a material such as reusable type 304 stainless steel plate with a 2B finish. The substrate 142 would typically be 0.075 inches thick and be mechanically and chemically cleaned The first step in the manufacture of the panel 160 is to deposit, by a process such as electroplating, a uniform thin first layer 140 of a conductive material such as copper on the substrate 142 so as to form a layer of approximately 0.0004 inches of copper over the entire substrate 122. Note that although other known methods of deposition such as electroless chemical processes or spraying processes including sputtering, evaporation and ion deposition are available,, electroplating is a preferred method of deposition. The copper layer 140 serves as a base layer upon which further electroplating may be applied, and also serves as a releasing material for separating the printed circuitry from the stainless steel substrate 142 after formation of the panel 16 is complete.

Figure 49:
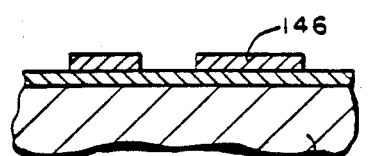
Figure 50:
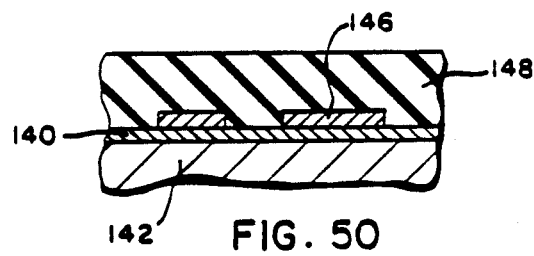
Figure 51:
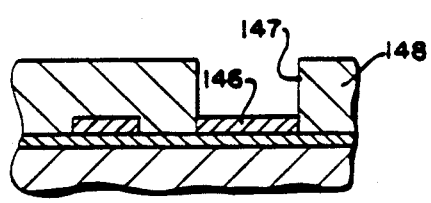
Figure 52:
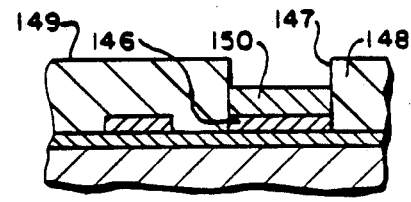

The copper layer 140 is then coated with a photosensitive resist layer 144 (FIG. 47) of a material such as that sold under the trademark DuPont Riston, masked with a first photomask of the circuit pattern desired to be impressed upon the layer 140, including selected positions 145 where component mounting pads are to be locate, and then the photoresist 144 is exposed to light, preferably from a collimated light source. The photoresist 144 is then developed away where the circuit pattern was, forming three-dimensional cavities 143,145 in the resist 144 and exposing the copper 140. A second layer 146 of conductive material such as copper is deposited, y a process such as electroplating, upon the exposed portions of the first layer 140 of conductive material (FIG. 48) to form a raised conductive first circuit pattern above the general plane of the conductive first layer 140 conforming to the three-dimensional cavity definition of the photosensitive resist 144 image. The remaining photoresist 144 is then stripped and removed (FIG. 49).

The raised circuit layer 146 is then embedded within a laminate insulating material 148 (FIG. 50) having a thickness greater than the height of the raised circuit layer. The laminate insulating material 148 is then removed from those selected areas 147 above the second conductive layer 1146 (FIG. 51) corresponding to the locations of the component mounting pads, preferably utilizing laser drilling. Using either a ruby laser or a carbon dioxide laser (not shown), it is possible to burn away the laminate insulating material 148 without affecting the copper layer 146 other than to expose it 146 for further processing.

Figure 53:
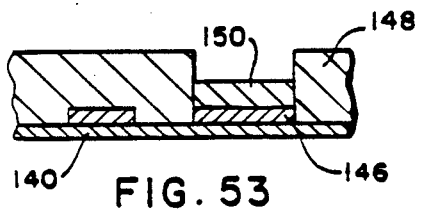
Figure 54:
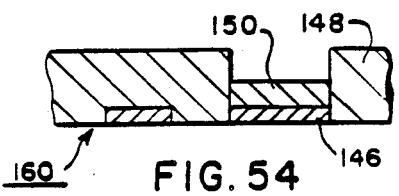

Once the laminate material 148 is removed from the area 147 above the layer 146, a layer 150 of solder is deposited (FIG. 52), preferably by a process such as eletroplating, upon the exposed surfaces of the second layer 146 of conductive material to a thickness less than the thickness of the laminate insulating material 148 above the second layer 146 so that the solder layer 150 will be recessed from the top surface 149 of the laminate material. The thin copper layer 140, with the circuitry 146, component mounting pads 150 and the epoxy 148 is then removed from the stainless steel substrate (FIG. 53). Finally, the copper flash layer 140 is etched away (FIG. 54), leaving circuitry 146 imbedded in an epoxy laminate insulating material 148 with solder pads 150 recessed in the laminate 148. This top panel 160 can then be laminated to the remainder of the multilayer printed wiring board. Electrical interconnection between this panel 160 and the remaining board can be accomplished either by the use of conventional plated through holes or by the addition of the plated pillars previously described.

Note that throughout the discussion the fabrication of each type of printed circuit board has been initiated using a foundational layer made b depositing a temporary flash layer of a conductive material such as copper upon a temporary substrate made of a material such as reuseable stainless steel plate Circuitry was built up from this temporary flash layer As a final step in preparing the printed circuit board, the stainless steel substrate was peeled away from the copper flashing and then the copper flashing was removed by etching the flashing from the printed circuit board. While copper is used for the flash layer and stainless steel is used for the substrate in the discussion, other materials may be used One of other possible combinations includes an aluminum substrate used in lieu of a stainless steel substrate with flashing deposited upon this.

While a substrate having a deposited flash layer is one preferred technique, this invention should not be limited to using only this type of a foundational layer.

Figure 55:
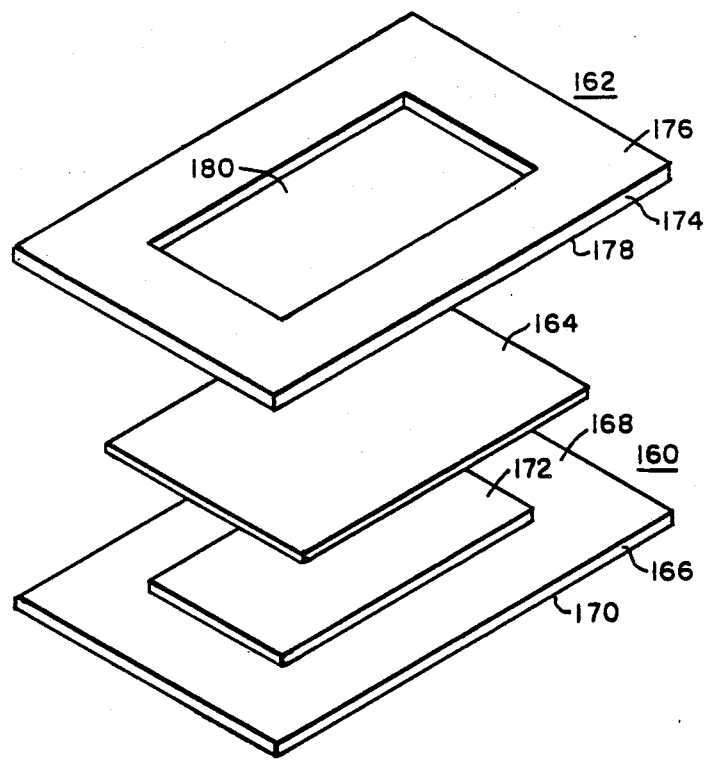
FIGS. 55-56 illustrate an alternative method to depositing an initial layer of conductive material onto a substrate to initiate the printed circuit board fabrication.

One alternative to this involves the use of a thin foil of an electrically conducting material mechanically clamped to a frame.This combination serves as a substitute for a flash layer deposited upon a substrate. The circuitry is deposited directly upon this thin foil One embodiment comprises at two-part frame 160 and 162 (FIG. 55) used to clamp the thin foil 164 such that circuitry may be deposited directly upon the foil 164. This deposition is in lieu of deposition of a layer of conductive material upon a substrate so that this foil may be used as the base layer in the fabrication of a printed circuit board. Both parts 160 and 162 of the frame are made of a lightweight, semi-flexible material such as polyimide. Fiber reinforced polyimide board may be used. The first part 160 of the frame is a generally flat rectangular plate 166 having a thickness of about 0.040 inches with an top surface 168 and a bottom surface 170. From the top surface 168 extends a raised flat platform 172. The platform 172 is approximately the shape of the the printed circuit board to be fabricated.

The second part 162 of the frame is a generally flat rectangular plate 174 having a thickness of about 0.040 inches, similar in shape to plate 166, with an top surface 176 and a bottom surface 178. The plate 174 has an opening 180 slightly larger than, although similar in shape to, the platform 172.

Figure 56:
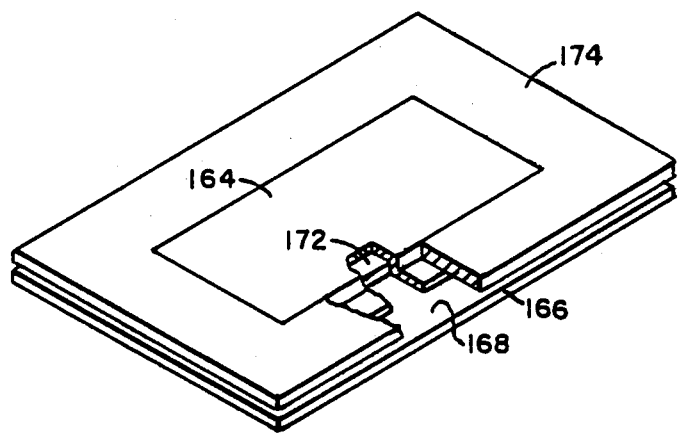

The thin foil 164, which has a thickness of about 0.001 inches, is placed between the two-art frame and the parts 160 and 162 are positioned parallel to one another such that the raised platform 172 is aligned with the opening 180. The parts 160 and 162 are then mechanically clamped together such that the top surface 168 of plate 166 compresses the foil 164 against the bottom surface 178 of plate 174, thereby forcing the raised platform 172 through the opening 180 and also forcing that portion of the foil 164 contacted by the raised platform 172 to protrude through the opening 180, as shown in FIG. 56. Note that for this reason the thickness of the platform 172 must be adequate for the platform 172 to penetrate the opening 180 so that the foil is at least flush with the top surface 176 of the plate 174. In this situation the platform 172 should be at least 0.040 inches thick, which is the thickness of the plate 174. Although not shown note that for ease of alignment of the two frame parts, registration holes may be drilled through one part for visual alignment with markers placed on the other part.

Just as circuitry is deposited directly upon the layer of conductive material on a substrate described in an earlier embodiment in this document, circuitry is deposited directly upon the framed thin foil and a printed circuit board is built up from this. After the printed circuit board is fabricated, the thin foil must be removed. This is easily done by disassembling the frame parts 160 and 162 and removing the foil 164 through etching. By design the opening 180 in plate 164 is large enough to fit around the printed circuit board when the frame is disassembled. For this arrangement a preferred material for the foil is either copper or aluminum. In this manner a structure exists that may be used in lieu of a substrate.

In both metal deposition onto a substrate and fixation of a foil onto a frame, a preferred material for the circuit lines which are deposited onto the flash layer or the foil is copper. Other conductive materials that may be used include nickel and gold.

Still another alternative for this invention involves the use of a substrate made of an electrically conducting material such that circuitry may be electroplated directly upon this substrate without an intermediate flash layer and the substrate may also be easily removed to expose the circuit lines. In order for this approach to be successful the substrate must be made of a different material than the circuit line such that the substrate may be etched away with a selected etchant that will attack the substrate material but will not attack the circuit lines, thereby preserving the quality and dimensions of the circuit lines. The selection of an etchant that will attack the substrate material but will not attack the circuit lines would be obvious to one skilled in the art.

While any number of conductive pairs may be used as substrate/circuit line materials, one preferred combination is copper for the circuit lines electroplated onto an aluminum substrate. In this situation the surface of the aluminum substrate must first be treated with an alkaline, aqueous, alkali metal zincate treating bath to promote adhesion between the aluminum substrate and the circuit lines.

Treating an aluminum surface with a zincated solution to increase adhesion is a process well known in the art. Such zincate baths, as described in U.S. Pat. Nos. 2,676,916 and 2,650,886, contain an alkali metal hydroxide, zinc oxide, a water soluable metal salt, such as a salt of iron; cobalt or nickel, and a complexing agent for the metal ions introduced as the water soluable metal salt, such as Rochelle salt, a tannate, or a sugar.

Other material combinations compatible with this process include the use of nickel or gold for the circuit lines electroplated onto a copper substrate although in these instances a zincate bath is not necessary.

Throughout this discussion panels have been laminated together to form printed circuit boards. A preferred method of lamination is through thermal compression which involves compressing two panel,, such as panels 10 and 30 in FIG. 16, against a laminating insulating material, such as 40, under sufficient pressure add temperature to form a bond not only between the panels and the laminating material, but also to form a bond between the two panels 10 and 30 such that the interconnect member 20 bonds to the layer 35. The temperature and pressure for this thermal compression technique for lamination would be known to one skilled in the art.

When the circuitry is copper, the thermal compression bonding between the interconnect member of one panel and the layer of another panel may be enhanced through the deposition, preferable by electroplating, of a thin layer of gold having a thickness of approximately 0.0004 inches upon the surface of the interconnect member that contacts the layer. This would require an additional deposition step following the deposition of the interconnect member involving a similar process but only depositing a different material. This additional deposition step would not be required if the circuitry is either gold or nickel.

Thus, what has been described is an improved multilayer printed wiring board which utilizes solid plated interconnections for the various layers and which can be fabricated with very detailed lines and spaces to provide a compact wiring board for very large scale integrated circuit requirements. The outer layer of the printed wiring board further is provided with recessed mounting pads to which the leads of the attached components can be mounted by using a vapor phase soldering process without incurring the problem of solder bridging between the various pads.

What is claimed is:

1. A method of fabricating a printed circuit board having recessed pads comprising the steps of:
   (a) providing a uniform first layer of conductive material;
   (b) depositing photosensitive resist onto said first layer of conductive material;
   (c) masking the photosensitive resist with a first photomask to define a conductive first circuit pattern on the surface of the resist;
   (d) exposing the masked photosensitive esist to light;
   (e) dissolving those portions of the resist corresponding to the conductive first circuit pattern to form three-dimensional cavities in the resist to expose said first layer of conductive material according to said first circuit pattern;
   (f) depositing a second layer of conductive material upon the exposed portions of said first layer of conductive material to form a raised conductive first circuit pattern above the general plane of said first layer of conductive material conforming to the three-dimensional cavity definition of the photosensitive resist image;
   (g) depositing photosensitive resist onto said second layer of conductive material;
   (h) masking the photosensitive resist with a second photomask to define a conductive second circuit pattern on the surface of the resist corresponding to the desired locations of component mounting pads;
   (i) exposing the masked photosensitive resist to light;
   (j) dissolving those portions of the resist corresponding to the conductive second circuit pattern to form three-dimensional cavities in the resist to expose said second layer of conductive material according to said second circuit pattern
   (k) depositing a thin third layer of conductive material upon the exposed portions of said second layer of conductive material with an electrically conducting material different from the material of the second layer to form a raised conductive second circuit pattern above the general plane of said second layer of conductive material;
   (l) depositing a fourth layer of conductive material upon said third layer of conductive material to further form the raised conductive second circuit pattern above the general plane of said third layer of conductive material conforming to the three-dimensional cavity definition of the photosensitive resist image;
   (m) removing previously undissolved photosensitive resist from said layers of conductive material;
   (n) embedding said raised conductive first and second circuit patterns on said first layer of conductive material within a uniform thickness of laminate insulating material with the surface of said fourth layer of conductive material being exposed;
   (o) etching away said fourth layer of conductive material until said third layer of conductive material is exposed;
   (p) depositing a fifth layer of conductive material upon the exposed surface of said third layer of conductive material to a thickness less than the thickness of said fourth layer of conductive material;
   (q) removing said first layer of conductive material from said laminate insulating material, whereby the fifth layer of conductive material is embedded in the laminate insulating material and exposed but recessed from the surface of the insulating material.

2. The method in claim 1 wherein:
   (a) the step of providing a uniform first layer of conductive material comprises depositing the first layer of conductive material onto a substrate of conducting material; and
   (b) the step of removing said first layer of conductive material from said laminate insulating material comprises separating said first layer of conductive material with its raised first and second circuit patterns from the substrate and etching away said first layer of conductive material from the laminate insulating material.

3. The method in claim 2 wherein:
   (a) the first layer of conductive material is copper; and
   (b) the conductive material of the substrate is stainless steel; and
   (c) the conductive material used to form the conductive circuit patterns is a metal selected from the group consisting of copper, nickel and gold.

4. The method in claim 2 wherein:
   (a) the first layer of conductive material is copper; and
   (b) the conductive material of the substrate is aluminum treated with a zinc treating bath to enhance the adhesion characteristics of the aluminum; and
   (c) the conductive material used to form the conductive circuit patterns is a metal selected from the group consisting of copper, nickel and gold.

5. The method in claim 1 wherein:
   (a) the step of providing a uniform first layer of conductive material comprises providing a substrate of a conductive material different than that of the circuit lines, such that a selected etchant will attack only the substrate and not attach the circuit line material; and
   (b) the step of removing said first layer of conductive material from said laminate insulating material comprises etching away from said laminate insulating material the entire conductive substrate which is the first layer of conductive material.

6. The method of claim 5 wherein:
(a) the conductive material of the substrate is aluminum treated with a zinc treating bath to enhance the adhesion characteristics of the aluminum; and
(b) the conductive material used to form the conductive circuit patterns is a metal selected from the group consisting of copper, nickel and gold.

7. The method in claim 5 wherein:
(a) the conductive material of the substrate is copper; and
(b) the conductive material used to form the conductive circuit patterns is a metal selected from the group consisting of nickel and gold.

8. The method of claim 1 wherein:
(a) the step of providing a uniform first layer of conductive material comprises mechanically securing a thin foil of a conductive metal in a frame; and
(b) the step of removing said first layer of conductive material from said laminate insulating material comprises mechanically releasing the thin foil from the frame and etching away the first layer of conductive material from the laminate insulating material.

9. The method of claim 8 wherein:
(a) the conductive material of the thin foil is a metal selected from the group consisting of copper and gold; and
(b) the conductive material used to form the conductive circuit patterns is a metal selected from the group consisting of copper, nickel and gold.

10. The method according t claim 1 wherein the steps of depositing said first, second and fourth layers of conductive material comprises electrolytically forming said first, second and fourth layers of copper.

11. The method according to claim 10 wherein the step of depositing said third layer of conductive material comprises electrolytically forming said third layer of nickel.

12. The method according to claim 11 wherein the step of depositing said fifth layer of conductive material comprises electrolytically forming said fifth layer of solder.

13. The method according to claim 1 wherein the deposition steps are performed by electroplating.

14. The method according to claim 1 including the further stop of depositing a sixth layer of conductive material upon the exposed surface of said fifth layer of conductive material.

15. The method according to claim 14 including the further step of removing said sixth layer of conductive material from said fifth layer of conductive material after said first layer of conductive material has been etched away from said laminate insulating material.

16. The method according to claim 1 wherein the step of embedding said first and second circuit patterns comprises covering said first and second circuit patterns with said laminate insulating material and then sanding said laminate insulating material to expose the surface of said fourth layer of conductive material.

17. A method of fabricating a printed circuit board having recessed pads comprising the steps of:
(a) providing a uniform first layer of conductive material;
(b) depositing photosensitive resist onto said first layer of conductive material;
(c) masking the photosensitive resist with a photomask to define a conductive circuit pattern, including selected positions where component mounting pads are to be located, on the surface of the resist;
(d) exposing the masked photosensitive resist to light;
(e) dissolving those portions of the resist corresponding to the conductive circuit pattern to form three-dimensional cavities in the resist to expose said first layer of conductive material according to said circuit pattern;
(f) depositing a second layer of conductive material upon the exposed portions of said first layer of conductive material to form a raised conductive circuit pattern above the general plane of said first layer of conductive material conforming to the three-dimensional cavity definition of the photosensitive resist image;
(g) removing previously undissolved photosensitive resist from said layers of conductive material;
(h) embedding said raised conductive circuit pattern on said first layer of conductive material within a laminate insulating material having a thickness greater than the height of the raised circuit pattern;
(i) forming a hole through the laminate insulating material to expose said second layer of conductive material at those selected positions where the component mounting pads are located;
(j) depositing a third layer of conductive material upon the exposed surfaces of said second layer of conductive material to a thickness less than the thickness of said insulating material above said second layer of conductive material;
(k) separating the first layer of conductive material with its raised circuit patterns from the substrate; and
(l) removing said first layer of conductive material from said laminate insulating material, whereby the third layer of conductive material is located in the laminate insulating material and is exposed but recessed from the surface of the insulating material.

18. The method in claim 17 wherein:
(a) the step of providing a uniform first layer of conductive material comprises depositing the first layer of conductive material onto a substrate of conducting material; and
(b) the step of removing said first layer of conductive material from said laminate insulating material comprises separating said first layer of conductive material with its raised first and second circuit patterns from the substrate and etching away said first layer of conductive material from the laminate insulating material.

19. The method in claim 18 wherein:
(a) the first layer of conductive material is copper; and
(b) the conductive material of the substrate is stainless steel; and
(c) the conductive material used to form the conductive circuit patterns is a metal selected from t he group consisting of copper, nickel and gold.

20. The method in claim 18 wherein:
(a) the first layer of conductive material is copper; and
(b) the conductive material of the substrate is aluminum treated with a zinc treating bath to enhance the adhesion characteristics of the aluminum; and (c) the conductive material used to form the conductive circuit patterns is a metal selected from the group consisting of copper, nickel and gold.

21. The method in claim 17 wherein:
(a) the step of providing a uniform first layer of conductive material comprises providing a substrate of a conductive material different than that of the circuit lines, such that a selected etchant will attack only the substrate material and hot the circuit line material; and
(b) the step of removing said first layer of conductive material from said laminate insulating material comprises etching away from said laminate insulating material the entire conductive substrate which is the first layer of conductive material.

22. The method of claim 21 wherein:
(a) the conductive material of the substrate is aluminum treated with a zinc treating bath to enhance the adhesion characteristics of the aluminum; and
(b) the conductive material used to form the conductive circuit patterns is a metal selected from the group consisting of copper, nickel and gold.

23. The method in claim 21 wherein:
(a) the conductive material of the substrate is copper; and
(b) the conductive material used to form the conductive circuit patterns is a metal selected from the group consisting of nickel and gold.

24. The method of claim 17 wherein:
(a) The step of providing a uniform first layer of conductive material comprises mechanically securing a thin foil of a conductive metal in a frame; and
(b) the step of removing said first layer of conductive material from said laminate insulating material comprises mechanically releasing the thin foil from the frame and etching away the first layer of conductive material from the laminate insulating material.

25. The method of claim 24 wherein:
(a) the conductive material of the thin foil is a metal selected from the group consisting of copper and gold; and
(b) the conductive material used to form the conductive circuit patterns is a metal selected from the group consisting of copper, nickel and gold.

26. The method according to claim 17 wherein the step of forming a hole comprises drilling a hole utilizing a laser.

27. The method according to claim 17 wherein the step of depositing a third layer of conductive material comprises depositing a layer of solder.

28. The method according to claim 17 wherein the steps of depositing conductive material comprise depositing conductive material by electroplating.

29. The method according to claim 17 wherein the first and second layers of conductive material comprise copper.

30. A method for fabricating a multilayer printed circuit board comprising the steps of:
(a) fabricating a first board panel having a raised electrically conductive first circuit pattern extending from a first layer of conductive material;
(b) fabricating a second board panel having a raised electrically conductive second circuit pattern extending from a second layer of conductive material and a raised electrically conducting third circuit pattern extending from said second circuit pattern;
(c) laminating said first board panel to said second board panel with a laminate insulating material being disposed therebetween electrically insulating said first circuit pattern from said second circuit pattern and with said third circuit pattern electrically contacting said first circuit pattern at selected portions thereof; and
(d) removing said first and second layers of conductive material from said laminate insulating material.

31. The method in claim 30 wherein:
(a) the step of fabricating the first board panel first layer of conductive material comprises depositing the first layer of conductive material onto a first substrate of conducting material;
(b) the step of removing said first layer of conductive material from said laminate insulating material comprises separating said first layer of conductive material with its raised first circuit pattern from the first substrate and etching away said first layer of conductive material from the laminate insulating material;
(c) the step of fabricating the second board panel second layer of conductive material comprises depositing the second layer of conductive material onto a second substrate of conducting material; and
(d) the step of removing said second layer of conductive material from said laminate insulating material comprises separating said second layer of conductive material with its raised second and third circuit patterns from the second substrate and etching away said second layer of conductive material from the laminate insulating material.

32. The method in claim 31 wherein:
(a) the first layer and second layer of conductive material are copper; and
(b) the conductive material of the first and second substrates is stainless steel; and
(c) the conductive material used to form the conductive circuit patterns is a metal selected from the group consisting of copper, nickel and gold.

33. The method in claim 31 wherein:
(a) the first layer and second layer of conductive material are copper; and
(b) the conductive material of the first and second substrates is aluminum treated with a zinc treating bath to enhance the adhesion characteristics of the aluminum; and
(c) the conductive material used to form the conductive circuit patterns is a metal selected from the group consisting of copper, nickel and gold.

34. The method in claim 30 wherein:
(a) the step of fabricating the first board panel first layer of conductive material comprises providing a substrate of a conductive material different than that of the circuit lines, such that a selected etchant will attack only the substrate material and not the circuit line material;
(b) the step of removing said first layer of conductive material from said laminate insulating material comprises etching away from said laminate insulating material the entire conductive substrate which is the first layer of conductive material;
(c) the step of fabricating the second board panel second layer of conductive material comprises providing a substrate of a conductive material different than that of the circuit lines, such that a selected etchant will attack only the substrate material and not the circuit line material; and (d) the step of removing said second layer of conductive material from said laminate insulating material comprises etching away from said laminate insulating material the entire conductive substrate which is the second layer of conductive material.

35. The method of claim 34 wherein:
(a) the conductive material of the first and second substrates is aluminum treated with a zinc treating bath to enhance the adhesion characteristics of the aluminum; and
(b) the conductive material used to form the conductive circuit patterns is a metal selected from the group consisting of copper, nickel and gold.

36. The method in claim 34 wherein:
(a) the conductive material of the first and second substrates is copper; and
(b) the conductive material used to form the conductive circuit patterns is a metal selected from the group consisting of nickel and gold.

37. The method of claim 30 wherein:
(a) the step of fabricating the first board panel first layer of conductive material comprises mechanically securing a thin foil of a conductive metal in a frame;
(b) the step of removing said first layer of conductive material from said laminate insulating material comprises mechanically releasing the thin foil from the frame and etching away the first layer of conductive material from the laminate insulating material;
(c) the step of fabricating the second board panel second layer of conductive material comprises mechanically securing a thin foil of a conductive metal in a frame; and
(d) the step of removing said second layer of conductive material from said laminate insulating material comprises mechanically releasing the thin foil from the frame and etching away the second layer of conductive material from the laminate insulating material.

38. The method of claim 37 wherein:
(a) the conductive material of the thin foil is a metal selected from the group consisting of copper and gold; and
(b) the conductive material used to form the conductive circuit patterns is a metal selected from the group consisting of copper, nickel and gold.

39. The method of claim 30 wherein laminating said first board panel to said second board panel is performed through the process of thermal compression.

40. A method for fabricating a multilayer printed circuit board comprising the steps of:
(a) fabricating a first board panel by:
  (i) providing a uniform first layer of conductive material;
  (ii) depositing photosensitive resist onto said first layer of conductive material;
  (iii) masking the photosensitive resist with a first photomask to define a conductive first circuit pattern on the surface of the resist;
  (iv) exposing the masked photosensitive resist to light;
  (v) dissolving those portions of the resist corresponding to the conductive first circuit pattern to form three-dimensional cavities in the resist to expose said first layer of conductive material according to said first circuit pattern;
  (vi) electrolytically forming a second layer of conductive material upon the exposed portions of said first layer of conductive material to form a raised conductive first circuit pattern above the general plane of said first layer of conductive material conforming to the three-dimensional cavity definition of the photosensitive resist image;
  (vii) removing previously undissolved photosensitive resist from said first layer of conductive material to expose top and sidewall surface portions of said raised conductive first circuit pattern configured to the shape of said three-dimensional cavity;
  (viii) treating at least the threedimensional top and sidewall surface portions of said raised conductive first circuit pattern so as to provide a coating on said surface portions to enhance the adhesion properties of said surface portions to laminate insulator materials; and
  (ix) separating the first layer of conductive material with its raised first circuit pattern from the first substrate;
(b) fabricating a second board panel by:
  (i) providing a uniform third layer of conductive material;
  (ii) depositing photosensitive resist onto said third layer of conductive material;
  (iii) masking the photosensitive resist with a second photomask to define a conductive second circuit pattern on the surface of the resist;
  (iv) exposing the masked photosensitive resist to light;
  (v) dissolving those portions of the resist corresponding to the conductive second circuit pattern to form threedimensional cavities in the resist to expose said third layer of conductive material according to said second circuit pattern;
  (vi) electrolytically forming a fourth layer of conductive material upon the exposed portions of said third layer of conductive material to form a raised conductive second circuit pattern above the general plane of said third layer of conductive material conforming to the threedimensional cavity definition of the photosensitive resist image;
  (vii) depositing photosensitive resist onto said fourth layer of conductive material;
  (viii) masking the photosensitive resist with a third photomask to define a conductive third circuit pattern on the surface of the resist corresponding to the desired locations of interlayer connection members;
  (ix) exposing the masked photosensitive resist to light;
  (x) dissolving those portions of the resist corresponding to the conductive third circuit pattern to form three-dimensional cavities in the resist to expose said fourth layer of conductive material according to said third circuit pattern;
  (xi) electrolytically forming a fifth layer of conductive material upon the exposed portions of said fourth layer of conductive material to form a raised conductive third circuit pattern above the generally plane of said fourth layer of conductive material conforming to the three-dimensional cavity definition of the photosensitive resist image;

(xii) removing previously undissolved photosensitive resist from said third and fourth layers of conductive material to expose top and sidewall surface portions of said raised conductive second and third circuit patterns;
(xiii) treating at least the three-dimensional top and sidewall surface portions of said raised conductive second and third circuit patterns so as to provide a coating on said surface portions to enhance the adhesion properties of said surface portions to laminate insulator materials; and
(xiv) separating the third layer of conductive material with its raised second and third circuit patterns from the second substrate;
(c) aligning said first and second board panels with each other such that said first circuit pattern faces said second and third circuit patterns, and said fifth layer of conductive material electrically contacts selected portions of said second layer of conductive material;
(d) laminating said first board panel to said second board panel with a laminate insulating material being disposed between, and electrically insulating, said first circuit pattern from said second circuit pattern and
(e) etching away said first and third layers of conductive material from said laminate insulating material; whereby the conductive circuit patterns embedded in the laminate insulating material are exposed and lay flush and coplanar with the surface of the insulator material, with uniform cross-sectional thickness across the entire circuit board.

* * * * *